(12) United States Patent
Yeom et al.

(10) Patent No.: US 10,784,082 B2
(45) Date of Patent: Sep. 22, 2020

(54) APPARATUS FOR GENERATING PLASMA AND APPARATUS FOR TREATING SUBSTRATE HAVING THE SAME

(71) Applicant: Research & Business Foundation Sungkyunkwan University, Suwon-si (KR)

(72) Inventors: Geun Young Yeom, Seoul (KR); Kyung Chae Yang, Anyang-si (KR); Hyun Woo Tak, Yongin-si (KR); Ye Ji Shin, Hwaseong-si (KR); Da In Sung, Daejeon (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/275,523

(22) Filed: Feb. 14, 2019

(65) Prior Publication Data

US 2019/0252153 A1    Aug. 15, 2019

(30) Foreign Application Priority Data

Feb. 14, 2018    (KR) .......................... 10-2018-0018622

(51) Int. Cl.
*H01J 37/32* (2006.01)

(52) U.S. Cl.
CPC ..... *H01J 37/3211* (2013.01); *H01J 37/32119* (2013.01); *H01J 37/32183* (2013.01)

(58) Field of Classification Search
CPC ............. H01J 37/32009; H01J 37/3211; H01J 37/32165; H01J 37/32183
See application file for complete search history.

(56) References Cited

U.S. PATENT DOCUMENTS

| | | | | |
|---|---|---|---|---|
| 5,368,710 A | * | 11/1994 | Chen ..................... | C23C 16/507 204/192.32 |
| 5,401,350 A | * | 3/1995 | Patrick .................. | H01J 37/321 118/723 I |
| 5,571,366 A | * | 11/1996 | Ishii .................. | H01J 37/32082 156/345.26 |

(Continued)

FOREIGN PATENT DOCUMENTS

| | | |
|---|---|---|
| JP | 2008-98339 A | 4/2008 |
| JP | 2010-3699 A | 1/2010 |

(Continued)

*Primary Examiner* — Jason Crawford

(74) *Attorney, Agent, or Firm* — NSIP Law

(57) ABSTRACT

Disclosed is an inductively-coupled plasma-generating device including: a first power supply for supplying high frequency power; a second power supply for supplying low frequency power; a single coil-based plasma source including at least two antennas which comprise a first antenna having one end as a grounded end and the other end, wherein the first power supply is connected to the first antenna at a point thereof adjacent to the grounded end to receive the high frequency power; and a second antenna surrounded by the first antenna, wherein the second antenna has one end connected to the first antenna and the other end as a low frequency power receiving end connected to the second power supply; and a gas supply for supplying a gas, wherein the gas is excited into plasma by the single coil-based plasma source.

13 Claims, 5 Drawing Sheets

(56) References Cited

U.S. PATENT DOCUMENTS

| | | | | |
|---|---|---|---|---|
| 6,077,384 | A * | 6/2000 | Collins | A21D 2/185 |
| | | | | 118/723 I |
| 6,270,617 | B1 * | 8/2001 | Yin | H01J 37/321 |
| | | | | 156/345.48 |
| 6,274,502 | B1 * | 8/2001 | Ohkuni | H01J 37/321 |
| | | | | 216/68 |
| 6,361,644 | B1 * | 3/2002 | Collins | H01J 37/321 |
| | | | | 118/723 I |
| 6,468,388 | B1 * | 10/2002 | Hanawa | H01J 37/32082 |
| | | | | 118/723 AN |
| 2002/0004309 | A1 * | 1/2002 | Collins | H01J 37/3266 |
| | | | | 438/719 |
| 2005/0202183 | A1 * | 9/2005 | Matsuda | H01J 37/321 |
| | | | | 427/569 |
| 2005/0241762 | A1 * | 11/2005 | Paterson | H01J 37/321 |
| | | | | 156/345.28 |
| 2006/0211224 | A1 * | 9/2006 | Matsuda | C23C 16/45544 |
| | | | | 438/493 |
| 2007/0017446 | A1 * | 1/2007 | Jeon | H01L 21/67069 |
| | | | | 118/723 I |
| 2007/0246163 | A1 * | 10/2007 | Paterson | C23C 16/458 |
| | | | | 156/345.48 |
| 2008/0017317 | A1 * | 1/2008 | Jeon | H05H 1/46 |
| | | | | 156/345.38 |
| 2008/0099450 | A1 * | 5/2008 | Lewington | H01J 37/32091 |
| | | | | 219/121.58 |
| 2008/0156771 | A1 * | 7/2008 | Jeon | H01J 37/3233 |
| | | | | 216/66 |
| 2009/0139963 | A1 * | 6/2009 | Panagopoulos | H01J 37/32165 |
| | | | | 216/68 |
| 2009/0162260 | A1 * | 6/2009 | Bera | B01J 19/26 |
| | | | | 422/186.04 |
| 2012/0031561 | A1 * | 2/2012 | Kim | H01J 37/3211 |
| | | | | 156/345.48 |
| 2013/0199727 | A1 * | 8/2013 | Iwata | H01J 37/32091 |
| | | | | 156/345.28 |
| 2014/0273537 | A1 * | 9/2014 | Lo | C23C 16/507 |
| | | | | 438/798 |
| 2015/0235809 | A1 * | 8/2015 | Ito | H01J 37/32165 |
| | | | | 156/345.48 |
| 2016/0079037 | A1 * | 3/2016 | Hirano | H01J 37/32091 |
| | | | | 156/345.28 |
| 2016/0322242 | A1 * | 11/2016 | Nguyen | H01L 21/68785 |
| 2017/0301514 | A1 * | 10/2017 | Cho | H01J 37/32633 |

FOREIGN PATENT DOCUMENTS

| | | |
|---|---|---|
| KR | 10-2010-0129368 A | 12/2010 |
| KR | 10-2012-0066990 A | 6/2012 |

* cited by examiner

APPARATUS FOR GENERATING PLASMA AND APPARATUS FOR TREATING SUBSTRATE HAVING THE SAME

CROSS REFERENCE TO RELATED APPLICATIONS

This application claims the benefit under 35 USC § 119(a) of Korean Patent Application No. 10-2018-0018622 filed on Feb. 14, 2018, in the Korean Intellectual Property Office, the entire disclosure of which is incorporated herein by reference for all purposes.

TECHNICAL FIELD

The present disclosure relates to a plasma-generating device and a substrate-treating apparatus comprising the same. More particularly, the present disclosure relates to an inductively coupled-type plasma-generating device, and a substrate-treating apparatus comprising the same.

BACKGROUND ART OF THE INVENTION

In a semiconductor or display manufacturing process, plasma is used in various processes such as dry etching, chemical vapor deposition, and sputtering in order to treat a substrate or deposit a thin film on a substrate. Plasma-generating devices include an inductively coupled type and capacitive coupled type plasma-generating devices.

In the inductively coupled type plasma-generating device, generated plasma has a high density but the plasma may be generated non-uniformly. In order to improve the uniformity of the plasma, it is necessary to add a new component to the plasma generating apparatus or to modify existing components. This may complicate a structure of the plasma generating apparatus. Further, there is a limitation to optimizing a driving scheme that may be stably applied to the modified apparatus.

A scheme of simultaneously applying two different frequencies to a portion of a coil for plasma generation has been proposed for improving the uniformity of the plasma while minimizing the change of the structure of the apparatus. In this connection, in this approach, a long coil is required in order to solve impedance mismatch which may occur due to a difference between frequencies. However, sufficient inductance cannot be secured, and, thus, a problem that discharge is not performed properly may occur continuously.

DESCRIPTION

Challenge to Solve

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a plasma-generating device in which frequency adjustment in a wide range may be enabled by allowing sufficient inductance at low frequencies to be obtained even when different frequencies are applied to a single coil, such that the plasma may be stably generated while the uniformity of plasma via uniform power distribution may be improved.

Another purpose of the present disclosure is to provide a substrate-treating apparatus including the plasma-generating device as described above, in which the substrate-treating apparatus may be supplied with the uniform plasma as generated by the plasma-generating device as described above and thus may improve reliability of the substrate treatment process.

Solution to the Problem

In one aspect of the present disclosure, there is provided an inductively-coupled plasma-generating device including: a first power supply for supplying high frequency power; a second power supply for supplying low frequency power; a single coil-based plasma source including at least two antennas which comprise a first antenna having one end as a grounded end and the other end, wherein the first power supply is connected to the first antenna at a point thereof adjacent to the grounded end to receive the high frequency power; and a second antenna surrounded by the first antenna, wherein the second antenna has one end connected to the first antenna and the other end as a low frequency power receiving end connected to the second power supply; and a gas supply for supplying a gas, wherein the gas is excited into plasma by the single coil-based plasma source.

In one implementation of the inductively-coupled plasma-generating device, each of the first and second antennas has a ring shape, and the first and second antennas are concentric with each other, and the two ends of the first antenna define a first spacing therebetween, and the two ends of the second antenna define a second spacing, wherein the first and second antennas are connected to each other such that the first spacing has the same orientation as the second spacing.

In one implementation of the inductively-coupled plasma-generating device, the first power supply includes a high frequency matching circuitry, and the second power supply includes a low frequency matching circuitry, wherein the high frequency matching circuitry and the low frequency matching circuitry remove impedance mismatch due to a frequency difference.

In one implementation of the inductively-coupled plasma-generating device, the single coil-based plasma source further includes third and fourth antennas disposed between the first antenna and the second antenna, wherein each of the third and fourth antennas has a ring shape, and the first to fourth antennas are concentric with each other, and two ends of the third antenna define a third spacing therebetween, and two ends of the fourth antenna define a fourth spacing, wherein the first to fourth spacings have the same orientation, wherein the first and third antennas are connected to each other and the fourth and second antennas are connected to each other.

In one implementation of the inductively-coupled plasma-generating device, the first power supply is applied to a second end of the first antenna opposite to a first end which is the one end of the first antenna, wherein the second end of the first antenna is connected to one end of the third antenna.

In one implementation of the inductively-coupled plasma-generating device, the first power supply is applied to a position between a first end of the first antenna which is the grounded end of the first antenna and a second end of the first antenna opposite to the first end of the first antenna.

In one embodiment, the inductively-coupled plasma-generating device may further comprise first and second filters for preventing the high frequency power from being applied to the low frequency power, wherein the first filter is disposed between the first power supply and the first antenna, and the second filter is disposed between the second power supply and the second antenna.

In one embodiment, the inductively-coupled plasma-generating device may further comprise a dielectric window disposed between the single coil-based plasma source and the gas supply.

In one implementation of the inductively-coupled plasma-generating device, a thickness of the dielectric window in a region corresponding to the first antenna to which the high frequency power is applied is larger than a thickness of the dielectric window in a region corresponding to the second antenna to which the low frequency power is applied.

In one embodiment, the inductively-coupled plasma-generating device may further comprise at least one power supply which applies a power having a frequency which is different from the high frequency power and the low frequency power to a third antenna, wherein the single coil-based plasma source further comprises the third antenna.

In one aspect of the present disclosure, there is provided a substrate-treating apparatus including the plasma-generating device according to one of claims 1 to 10, wherein the substrate-treating apparatus treats a target substrate using the plasma supplied from the plasma-generating device.

In one embodiment, the substrate-treating apparatus may further comprise a plasma converting unit disposed between a process chamber receiving the target substrate therein and the plasma-generating device, wherein the plasma converting unit is configured to convert the plasma from the plasma-generating device into ion beams or neutral beams and feed the ion beams or neutral beams into the target substrate.

Effects of the Invention

According to the plasma-generating device in accordance with the present disclosure as described above and to the substrate-treating apparatus including the same, there occurs an advantage that the plasma discharge may be stably performed merely by applying the low frequency power and the high frequency power to the single coil-based plasma source though the existing hardware configuration is not significantly modified or remodeled. Conventionally, when different frequencies are applied to a single coil, there occurs a problem that the uniform plasma discharge does not occur due to the difference between the frequencies. However, according to the present disclosure, frequency adjustment in a wide range may be enabled by allowing sufficient inductance at low frequencies to be obtained even when different frequencies are applied to a single coil. Thus, the plasma may be stably generated while the uniformity of plasma via uniform power distribution may be improved. Further, the substrate-treating apparatus may be supplied with the uniform plasma as generated by the plasma-generating device as described above and thus may improve reliability of the substrate treatment process.

DETAILED DESCRIPTION OF INVENTION

Figure 1:
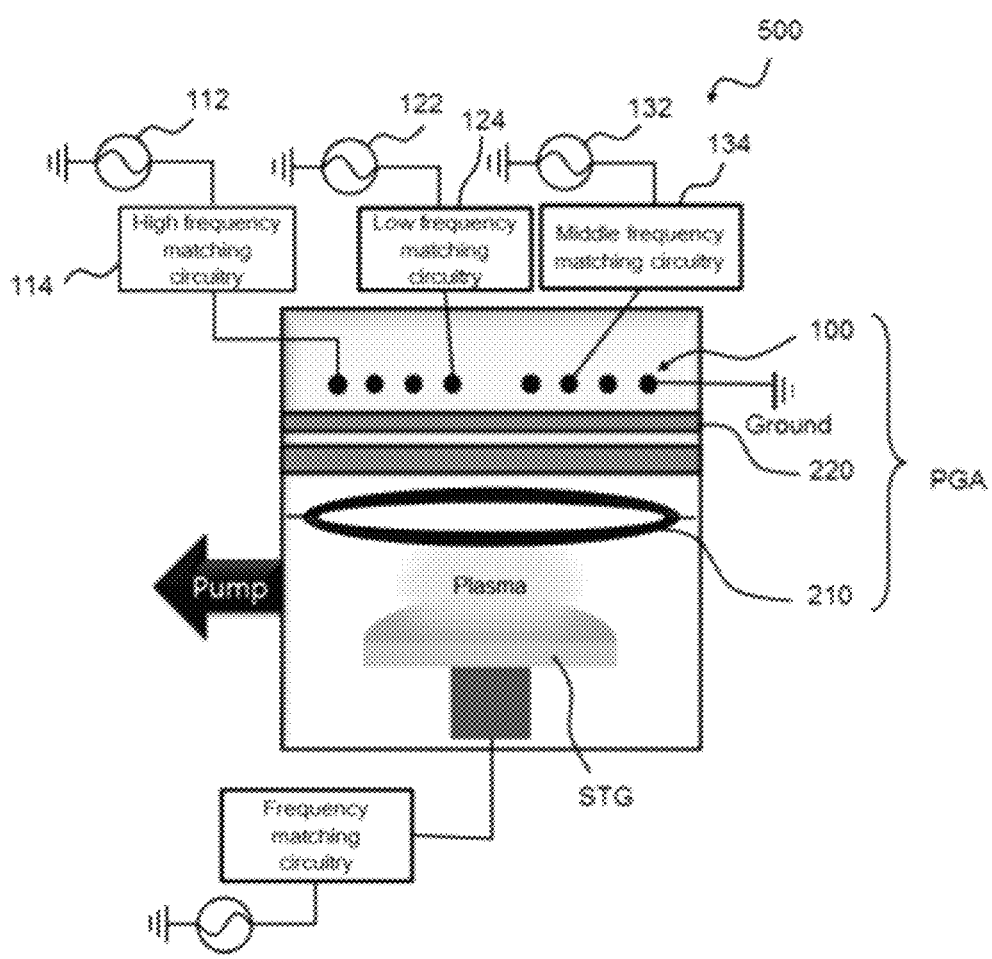
FIG. 1 is an illustration of a substrate-treating apparatus according to one embodiment of the present disclosure.

Hereinafter, example embodiments according to the present invention are described with reference to accompanying drawings in detail. Since the present disclosure may have diverse modified embodiments, preferred embodiments are illustrated in the drawings and are described in the detailed description of the invention. However, this does not limit the present disclosure within specific embodiments and it should be understood that the present disclosure covers all the modifications, equivalents, and replacements within the idea and technical scope of the present disclosure. In description of the drawings, like reference numerals in the drawings denote like elements. In the drawings, dimensions of structures are enlarged or exaggerated for clarity.

It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment.

In the following description, the technical terms are used only for explaining a specific exemplary embodiment while not limiting the present disclosure. The terms of a singular form may include plural forms unless referred to the contrary. The meaning of 'include' or 'comprise' specifies a property, a numeral, a step, an operation, an element or a combination thereof, but does not exclude other properties, numerals, steps, operations, elements or combinations thereof.

Unless terms used in the present invention are defined differently, the terms may be construed as meaning known to those skilled in the art. Terms such as terms that are generally used and have been in dictionaries should be construed as having meanings matched with contextual meanings in the art. In this description, unless defined clearly, terms are not ideally, excessively construed as formal meanings.

Figure 2:
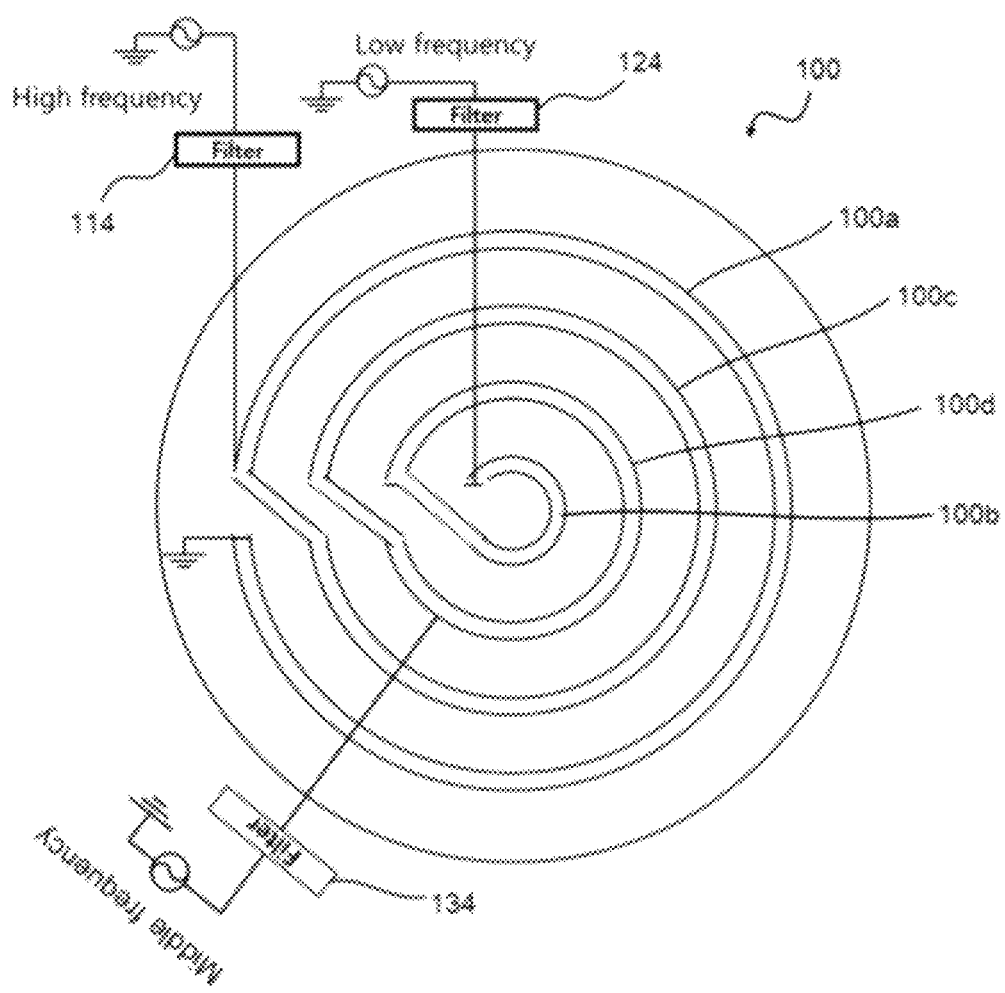
FIG. 2 is an illustration of a structure of a single coil-based plasma source in the plasma-generating device of FIG. 1 and of frequency application for discharge.

FIG. 1 is an illustration of a substrate-treating apparatus according to one embodiment of the present disclosure. FIG. 2 is an illustration of a structure of a single coil-based plasma source in the plasma-generating device of FIG. 1 and of frequency application for discharge.

Referring to FIG. 1 and FIG. 2, a substrate-treating apparatus 700 according to an embodiment of the present disclosure is configured treating a target substrate using plasma. To this end, the substrate-treating apparatus 700 includes a plasma-generating device PGA that produces plasma. The plasma generated by the plasma-generating device PGA may be supplied to a stage STG on which the target substrate is placed.

The plasma-generating device PGA includes a single coil-based plasma source 100, a gas supply 210, and a dielectric window 220. The single coil-based plasma source 100 is supplied with both low frequency power and high frequency power.

A single coil of the single coil-based plasma source 100 has a first end as a grounded end, and a second end supplied with the low frequency power. The high frequency power is applied to a portion of the coil between the grounded end and the second end and adjacent to the grounded end.

The high frequency power is supplied from a first power supply including a first power generator 112 and a high frequency matching circuitry 114 to the single coil-based plasma source 100. The impedance matching may be realized by the high frequency matching circuitry 114. Although not shown in the drawing, the first power supply may further include a first controller that controls the first power generator 112 or the high frequency matching circuitry 114 to enable the impedance matching.

The low frequency power is supplied to the single coil-based plasma source 100 from a second power supply including a second power generator 122 and a low frequency matching circuitry 124. The impedance matching may be realized by the low frequency matching circuitry 124. In addition, the second power supply may further include a second controller (not shown) to control the second power generator 122 or the low frequency matching circuitry 124 to enable the impedance matching.

Filters 116 and 126 may be disposed between the single coil-based plasma source 100 and the first power supply and the second power supply respectively. The filters 116 and 126 may prevent the high frequency power from being applied to the low frequency power.

The single coil-based plasma source 100 includes at least two or more antennas that are connected to each other to form the single coil. The antennas are connected together to form the single coil-based plasma source. Each of the antennas may have a ring shape having a spacing. A first antenna is disposed at the outermost of the single coil-based plasma source 100. Then, a second antenna is disposed within the first antenna in a concentric manner thereto and is connected to the first antenna. In this connection, a spacing of the first antenna and a spacing of the second antenna may be oriented in the same direction.

That is, one of two ends defining the spacing of the first antenna is connected to one of two ends defining the spacing of the second antenna as shown in FIG. 2. Hereinafter, one of the two ends of each antenna provided is referred to as a first end, while the other end thereof is referred to as a second end.

In one embodiment, the first end of the first antenna acts as the grounded end. The second end of the first antenna is connected to the first end of the second antenna. The second end of the second antenna is fed with the low frequency power. In this connection, the high frequency power is applied to a point of the first antenna between the grounded end and the second end.

In one embodiment, the single coil-based plasma source 100 may include four antennas as in FIG. 2. A first antenna 100a is disposed at the outermost of the single coil-based plasma source 100. Then, a second antenna 100b as the innermost antenna is disposed within the first antenna 100a in a concentric manner thereto. Then, third and fourth antennas 100c and 100d are arranged concentrically between the first and second antennas 100a and 100b. In this connection, linear spacings of the first to fourth antennas may be oriented in the same direction. That is, the first 100a, third 100c, fourth 100d and second 100b antennas may be arranged concentrically in this order from the outermost to the innermost. These antennas are connected together to form the single coil-based plasma source 100. In this connection, the first and second antennas 100a and 100b are connected via the third and fourth antennas 100c and 100d. In this connection, the second end of the first antenna 100a spaced from the grounded end of the first antenna 100a is connected to the first end of the third antenna 100c, and the second end of the third antenna 100c is connected to the first end of the fourth antenna 100d. Further, the second end of the fourth antenna 100d is connected to the first end of the second antenna 100b. The low frequency power is applied to the second end of the second antenna 100b. The high frequency power is applied to the second end of the first antenna 100a.

One end of the two ends of each antenna is connected not to an end of an adjacent antenna located in the same line as said one end in FIG. 2, but to an end of the adjacent antenna not located in the same line as said one end in FIG. 2. In other words, adjacent antennas may be connected via a linear connector connecting ends of the adjacent antennas spaced from each other at a longer distance. Thus, referring to FIG. 2, the single coil-based plasma source 100 may have a helical single coil configuration in which the coil extends from the grounded end of the first antenna along the third, fourth and second antennas in a counter-clockwise direction in a helical manner.

Alternatively, although not shown in the drawing, one end of the two ends of each antenna is connected not to an end of an adjacent antenna not located in the same line as said one end in FIG. 2, but to an end of the adjacent antenna located in the same line as said one end in FIG. 2. In other words, adjacent antennas may be connected via a linear connector connecting ends of the adjacent antennas spaced from each other at a shorter distance. Thus, the single coil-based plasma source 100 may have a single coil configuration in which the coil extends from the grounded end of the first antenna in a counterclockwise and then extends clockwise from an end of the third antenna in the same line as the grounded end and then extends along the fourth antenna in the counterclockwise direction and then is connected to the second antenna, and then extends along the second antenna in the clockwise direction. In this connection, the low frequency power may be applied to the end of the second antenna.

The low frequency power is applied to the second antenna, and the high frequency power is applied to an end of the first antenna adjacent to the grounded end. Thus, current flows from the innermost to the outermost in the single coil-based plasma source 100 composed of the four antennas. Accordingly, as the sufficient inductance is secured at the low frequency in the single coil-based plasma source 100, the impedance difference due to the frequency difference between the low frequency and the high frequency may be removed. This results in a stable discharge, so that both the low frequency power and the high frequency power may be applied to the single coil-based plasma source 100. As the electron distribution variation becomes easier, this also affects plasmaization of the gas supplied from the gas supply 210. Thus, the substrate-treating apparatus 500 may more easily control the etching, deposition, and the like of the target substrate.

FIG. 1 and FIG. 2 illustrate one example in which the first and second power supplies to supply the low frequency power and high frequency power respectively are used in discharging. However, the present disclosure is not limited thereto. A third power supply may be further included to generate plasma using triple frequencies in the single coil-based plasma source 100.

In one example, at least one variable element (not shown) may be connected to and between the antennas of the single coil-based plasma source 100. In this connection, the variable element may include a variable capacitor.

FIG. 1 and FIG. 2 illustrate one example in which the first and second power supplies to supply the low frequency power and high frequency power respectively are used in discharging. However, the present disclosure is not limited thereto. A third power supply 132 and a middle frequency matching circuitry 134 may be further included to generate plasma using triple frequencies in the single coil-based plasma source 100.

The gas supply 210 is disposed adjacent to the single coil-based plasma source 100. The gas supplied from the gas supply 210 to a reaction chamber is excited into the plasma state via the discharge of the single coil-based plasma source 100. The gas supply 210 may be provided below the single coil-based plasma source 100 and may have a form of a ring-shaped gas line having a plurality of gas injection holes.

The dielectric window 220 is interposed between the single coil-based plasma source 100 and the gas supply 210. The dielectric window 220 may reduce a capacitively-coupled plasma (CCP) component between the single coil-based plasma source 100 and the plasma. The reduction of the capacitively coupled plasma component may reduce the occurrence of sputtering, thereby preventing the life of the dielectric window 220 from decreasing, and, at the same time, may assist in energy transfer from the high frequency power to the plasma via inductive coupling.

According to the plasma-generating device PGA having the single coil-based plasma source 100 in accordance with the present disclosure as described above and to the substrate-treating apparatus 500 including the same, there occurs an advantage that the plasma discharge may be stably performed merely by applying the low frequency power and the high frequency power to the single coil-based plasma source 100 though the existing hardware configuration is not significantly modified or remodeled. Conventionally, when different frequencies are applied to a single coil, there occurs a problem that the uniform plasma discharge does not occur due to the difference between the frequencies. However, according to the present disclosure, frequency adjustment in a wide range may be enabled by allowing sufficient inductance at low frequencies to be obtained even when different frequencies are applied to the single coil based plasma source 100. Thus, the plasma may be stably generated while the uniformity of plasma via uniform power distribution may be improved. Further, the substrate-treating apparatus 500 may be supplied with the uniform plasma as generated by the plasma-generating device PGA as described above and thus may improve reliability of the substrate treatment process.

Hereinafter, referring to FIG. 3, FIG. 4 and FIG. 5, a substrate-treating apparatus according to another embodiment different from the substrate-treating apparatus as illustrated in FIGS. 1 and 2 will be exemplified. However, descriptions of substantially the same parts between the substrate-treating apparatuses according to the embodiments of the present disclosure are omitted. Differences therebetween will be exemplified with reference to the drawings.

Figure 3:
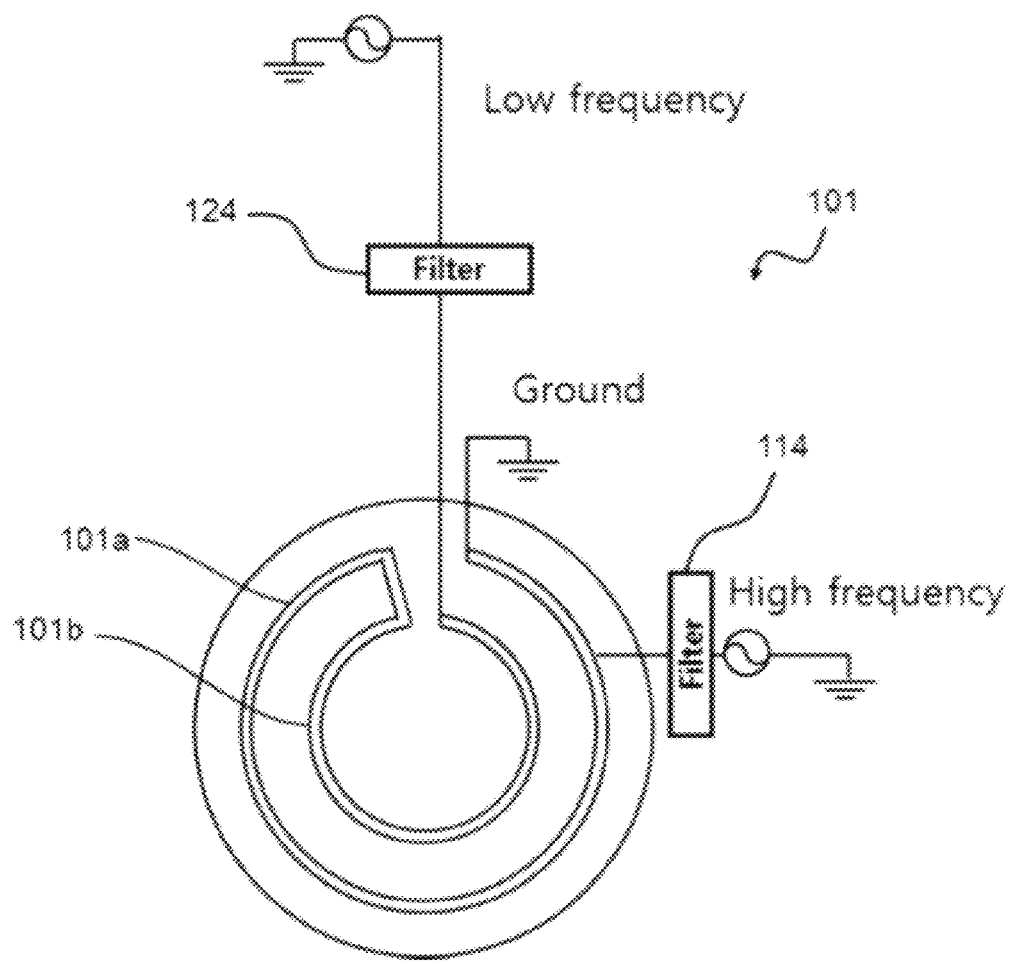
FIG. 3 is an illustration of a single coil-based plasma source of a different type than that of FIG. 2.

FIG. 3 is an illustration of a single coil-based plasma source of a different type from that of FIG. 2.

Referring to FIG. 3 together with FIG. 1 and FIG. 2, a single coil-based plasma source 101 of a different structure from that of the single coil-based plasma source 100 of FIG. 1 and FIG. 2 may be composed of a first antenna 101a disposed at the outermost and a second antenna 101b connected thereto and disposed inside the first antenna 101a in a concentric manner. In this connection, a first end of the first antenna 101a is grounded and thus acts as a grounded end. A second end of the first antenna 101a is connected to a first end of the second antenna 101b. The low frequency power is applied to a second end of the second antenna 101b.

The single coil extends clockwise from the grounded end of the first antenna and then extends counterclockwise from the first end of the second antenna. The low frequency power may be applied to the second end of the second antenna. The high frequency power may be applied to a point of the first antenna adjacent to the grounded end and spaced from the second end of the second antennas where the low frequency power is applied.

Figure 4:
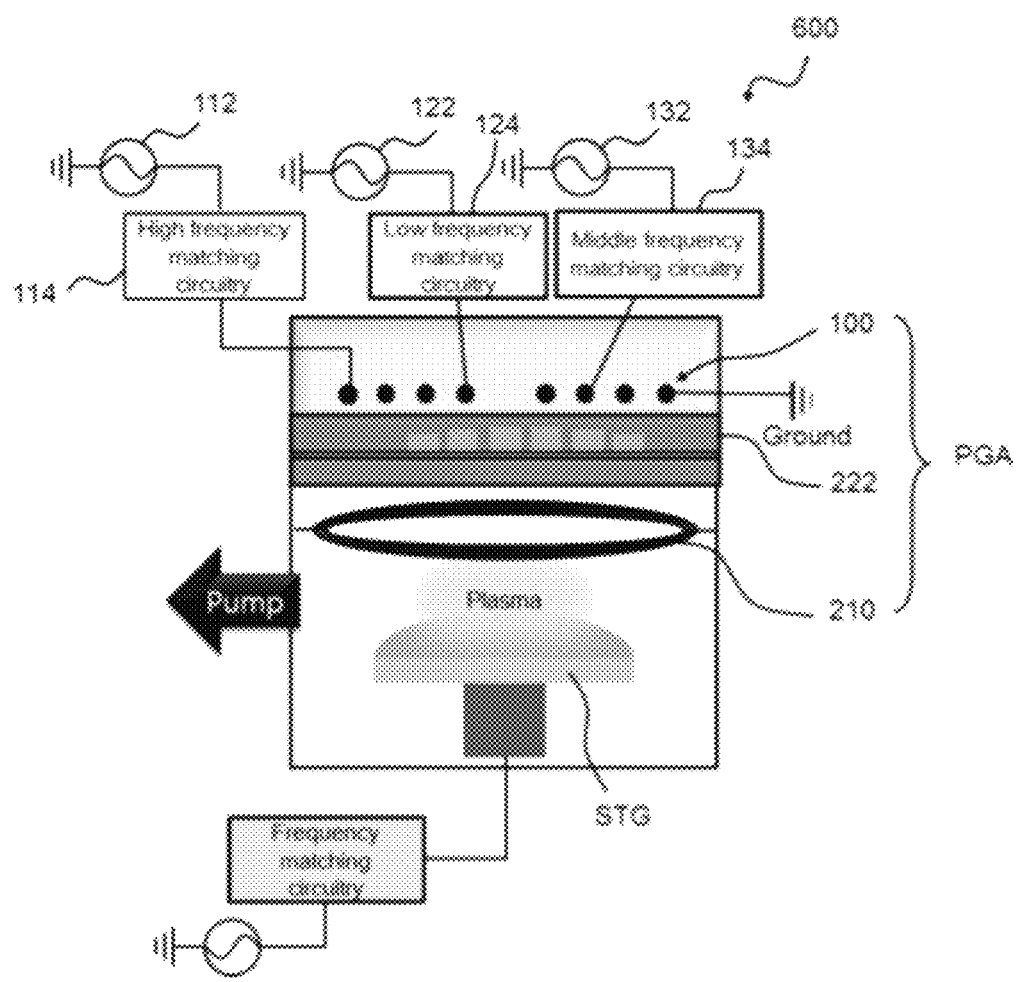
FIG. 4 is an illustration of a dielectric window structure that is different from that of FIG. 1.

FIG. 4 is a diagram for illustrating a structure of a dielectric window different from that of FIG. 1.

Referring to FIG. 4 together with FIG. 1 and FIG. 2, a dielectric window 222 having a structure different from that of the dielectric window 220 of FIG. 1 and FIG. 2 may be configured so as to have different thicknesses in regions respectively corresponding the antennas constituting the single coil-based plasma source 100.

A first thickness of the dielectric window 222 in a region corresponding to the first antenna to which the high frequency power is applied is large, while a second thickness of the dielectric window 222 in a region corresponding to the second antenna to which the low frequency power is applied is small. A third thickness of the dielectric window 222 in a region corresponding to the third antenna may be smaller than the first thickness and may be larger than the second thickness. A fourth thickness of the dielectric window 222 in a region corresponding to the fourth antenna may be smaller than the third thickness and be larger than the second thickness.

In FIG. 4, it is shown that a thickness of the dielectric window 222 in a region corresponding to each of regions between the antennas is equal to the first thickness. The present disclosure is not limited thereto. A thickness of the dielectric window 222 may be gradually decreased from a position corresponding to the first antenna to a position corresponding to the second antenna. That is, the dielectric window 222 may be formed in a dome shape. Further, in FIG. 4, a case where a cross-sectional shape is a rectangular shape is exemplarily shown as an example. The present disclosure is not limited thereto. The cross-sectional shape may be a trapezoidal shape.

A conventional dielectric window used for isolation between the plasma source and a vacuum chamber is embodied as a plate having a considerably large thickness in order to prevent breakage of the dielectric window due to a pressure difference resulting from a vacuum. However, this thick plate window may be prevented from being damage, but may cause a capacitively coupled plasma CCP component to be formed in addition to the inductively coupled plasma. Thus, there is a problem of loss of plasma generation efficiency. In accordance with the present disclosure, the thickness of the dielectric window 222 may vary based on the applied powers. This may provide for an optimal window structure that minimizes energy loss while minimizing the possibility of breakage of the dielectric window. That is, the dielectric window 222 having such a thickness configuration may more effectively reduce the capacitively coupled plasma CCP component occurring between the single coil-based plasma source 100 and the plasma while preventing the dielectric window 222 from breaking.

In FIG. 2, one example in which the dielectric window 222 with the thickness variation is used in combination with the single coil-based plasma source 100 including the four antennas is set forth by way of example. The present disclosure is not limited thereto. When using the single coil-based plasma source 101 as illustrated in FIG. 3, the thickness configuration of the dielectric window may be adapted to the two antennas.

Figure 5:
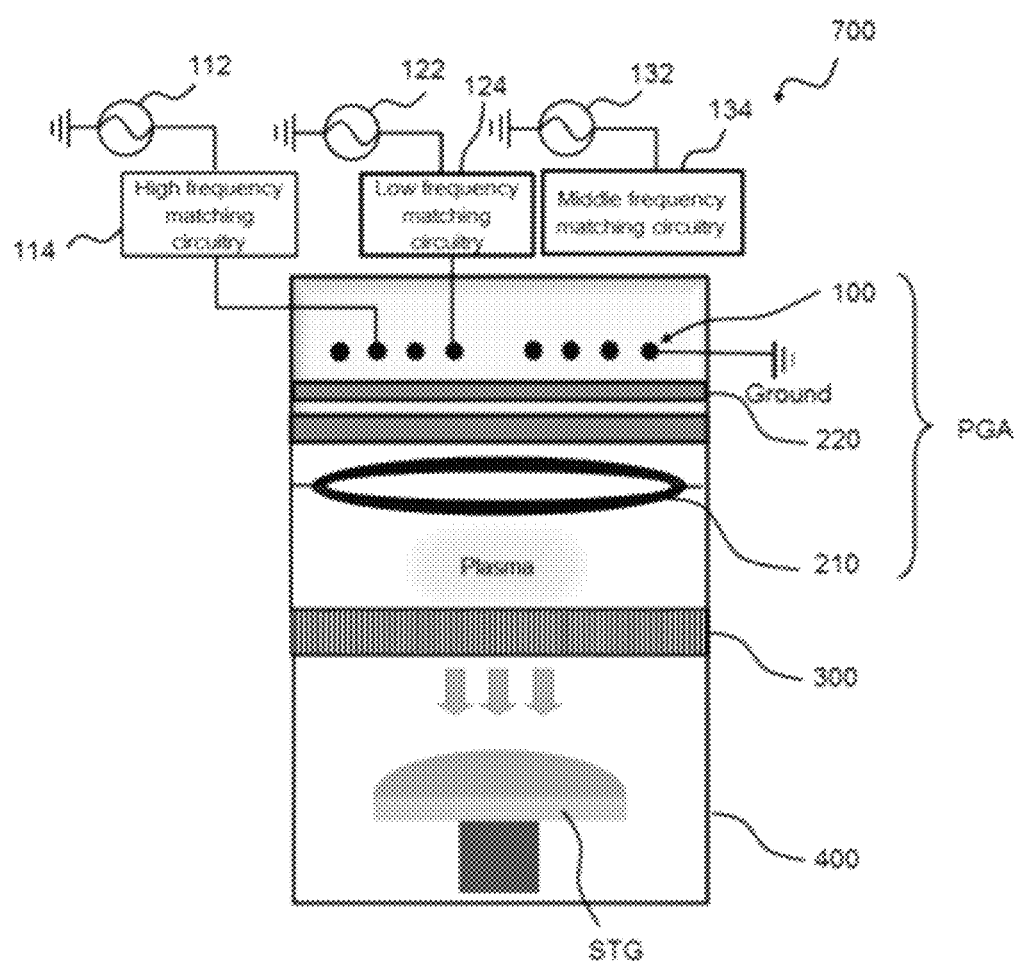
FIG. 5 is an illustration of a substrate-treating apparatus according to another embodiment of the present disclosure.

FIG. 5 is an illustration of a substrate-treating apparatus according to another embodiment of the present disclosure.

Referring to FIG. 5, the substrate-treating apparatus 700 further includes an plasma converting unit 300 and a substrate treatment chamber 400 together with the plasma-generating device PGA illustrated in FIGS. 1 and 2. The stage STG on which the target substrate is placed is disposed in the substrate treatment chamber 400.

The plasma converting unit 300 may be configured for receiving, guiding and converting the plasma generated by the plasma-generating device PGA into ion beams and supplying the ion beams to the substrate treatment chamber 400. The plasma converting unit 300 may be composed of a stack of grids having guide holes defined therein. Alternatively, when the plasma converting unit 300 further includes a plasma neutralization unit, the plasma converting unit 300 may feed neutral beams to the substrate treatment chamber 400.

Because, as described above, the plasma-generating device PGA according to the present disclosure may supply the uniform plasma, the ion beam or neutral beam may be uniformly generated. Thus, when the target substrate is treated using the uniform ion beams or neutral beams, the deposition or etching of the thin film is stably performed. In this way, the reliability of the treatment process can be improved.

While the present disclosure has been described with reference to preferred embodiments, those skilled in the art will appreciate that the present disclosure may be variously modified and changed without departing from the spirit and scope of the present disclosure set forth in the following claims.

The invention claimed is:

1. An inductively-coupled plasma-generating device including:
 a first power supply for supplying high frequency power;
 a second power supply for supplying low frequency power;
 a single coil-based plasma source including at least two antennas which comprise a first antenna having a first end as a grounded end and a second end, wherein the first power supply is connected to the first antenna at a point thereof adjacent to the first end to receive the high frequency power; a second antenna surrounded by the first antenna, wherein the second antenna has a third end connected to the first antenna and a fourth end as a low frequency power receiving end connected to the second power supply; and
 a gas supply for supplying a gas, wherein the gas is excited into plasma by the single coil-based plasma source,
 wherein, among the first end, the second end, the third end, and the fourth end, only the first end is the grounded end.

2. The inductively-coupled plasma-generating device of claim 1, wherein each of the first and second antennas has a ring shape, and the first and second antennas are concentric with each other, and
 the first end and the second end of the first antenna define a first spacing therebetween, and the third end and the fourth end of the second antenna define a second spacing, wherein the first and second antennas are connected to each other such that the first spacing has the same orientation as the second spacing.

3. The inductively-coupled plasma-generating device of claim 1, wherein the first power supply includes a high frequency matching circuitry, and the second power supply includes a low frequency matching circuitry,
 wherein the high frequency matching circuitry and the low frequency matching circuitry remove impedance mismatch due to a frequency difference.

4. The inductively-coupled plasma-generating device of claim 1, wherein single coil-based plasma source further includes third and fourth antennas disposed between the first antenna and the second antenna,
 wherein each of the third and fourth antennas has a ring shape, and the first to fourth antennas are concentric with each other, and two ends of the third antenna define a third spacing therebetween, and two ends of the fourth antenna define a fourth spacing,
 wherein the first to fourth spacings have the same orientation,
 wherein the first and third antennas are connected to each other and the fourth and second antennas are connected to each other.

5. The inductively-coupled plasma-generating device of claim 4, wherein the first power supply is applied to the second end of the first antenna opposite to the first end, wherein the second end of the first antenna is connected to one end of the third antenna.

6. The inductively-coupled plasma-generating device of claim 1, further comprising:
 first and second filters for preventing the high frequency power from being applied to the low frequency power, wherein the first filter is disposed between the first power supply and the first antenna, and the second filter is disposed between the second power supply and the second antenna.

7. The inductively-coupled plasma-generating device of claim 1, further comprising:
 a dielectric window disposed between the single coil-based plasma source and the gas supply.

8. The inductively-coupled plasma-generating device of claim 7, wherein a thickness of the dielectric window in a region corresponding to the first antenna to which the high frequency power is applied is larger than a thickness of the dielectric window in a region corresponding to the second antenna to which the low frequency power is applied.

9. The inductively-coupled plasma-generating device of claim 1, further comprising:
 at least one power supply which applies a power having a frequency which is different from the high frequency power and the low frequency power to a third antenna, wherein the single coil-based plasma source further comprises the third antenna.

10. A substrate-treating apparatus including the plasma-generating device according to claim 1, wherein the substrate-treating apparatus treats a target substrate using the plasma supplied from the plasma-generating device.

11. The substrate-treating apparatus of claim 10, further comprising:
 a plasma converting unit disposed between a process chamber receiving the target substrate therein and the plasma-generating device, wherein the plasma converting unit is configured to convert the plasma from the plasma-generating device into ion beams or neutral beams and feed the ion beams or neutral beams into the target substrate.

12. An inductively-coupled plasma-generating device including:
 a first power supply for supplying high frequency power;
 a second power supply for supplying low frequency power;

a single coil-based plasma source including at least two antennas which comprise a first antenna having a first end as a grounded end and a second end, wherein the first power supply is connected to the first antenna at a point thereof adjacent to the first end to receive the high frequency power; a second antenna surrounded by the first antenna, wherein the second antenna has a third end connected to the first antenna and a fourth end as a low frequency power receiving end connected to the second power supply; and a linear connector extending from the second end to the third end; and a gas supply for supplying a gas, wherein the gas is excited into plasma by the single coil-based plasma source.

13. An inductively-coupled plasma-generating device including:

a first power supply for supplying high frequency power;

a second power supply for supplying low frequency power;

a single coil-based plasma source including at least two antennas which comprise a first antenna having a first circular shape with a first diameter, and having a first end as a grounded end and a second end, wherein the first power supply is connected to the first antenna at a point thereof adjacent to the first end to receive the high frequency power; a second antenna having a second circular shape with a second diameter, and surrounded by the first antenna, wherein the second antenna has a third end connected to the first antenna and a fourth end as a low frequency power receiving end connected to the second power supply; and a gas supply for supplying a gas, wherein the gas is excited into plasma by the single coil-based plasma source, wherein, the first diameter is greater than the second diameter.

* * * * *